United States Patent
Chuang et al.

(10) Patent No.: US 7,178,130 B2
(45) Date of Patent: Feb. 13, 2007

(54) DIGITAL PROCESSING ARCHITECTURE USING COMPILED DATAFLOW DEFINITION

(75) Inventors: Dan Chuang, San Jose, CA (US); Che Fang, Sunnyvale, CA (US); Bicheng William Wu, Union City, CA (US)

(73) Assignee: NVidia Corporation, Santa Clara, CA (US)

( * ) Notice: Subject to any disclaimer, the term of this patent is extended or adjusted under 35 U.S.C. 154(b) by 590 days.

(21) Appl. No.: 10/342,888

(22) Filed: Jan. 14, 2003

(65) Prior Publication Data

US 2004/0139428 A1 Jul. 15, 2004

(51) Int. Cl.
*G06F 9/44* (2006.01)
(52) U.S. Cl. .................... 717/120; 717/121
(58) Field of Classification Search ......... 717/136–158
See application file for complete search history.

(56) References Cited

U.S. PATENT DOCUMENTS

| | | | | |
|---|---|---|---|---|
| 5,842,017 | A * | 11/1998 | Hookway et al. | 717/158 |
| 6,078,745 | A * | 6/2000 | De Greef et al. | 717/151 |
| 6,091,897 | A * | 7/2000 | Yates et al. | 717/138 |
| 6,226,789 | B1 * | 5/2001 | Tye et al. | 717/138 |
| 6,502,237 | B1 * | 12/2002 | Yates et al. | 717/136 |

* cited by examiner

Primary Examiner—Kakali Chaki
Assistant Examiner—Mark P. Francis
(74) Attorney, Agent, or Firm—Patterson & Sheridan, L.L.P.

(57) ABSTRACT

A system whereby a data flow language written in relatively high-level description is compiled to a hardware definition. The hardware definition is then used to configure data flow in a target processing system at execution time, or run time. In a preferred embodiment, the target processing system includes a Reduced-Instruction Set Computer (RISC) processor in communication with a finite state machine (FSM), shared memory, on-board memory, and other resources. The FSM is primarily used for accelerating matrix operations and is considered the target machine to be configured according to the dataflow definition. The RISC processor serves as a co-processor to an external central processing unit (CPU) that is a host processor for executing application code. Other embodiments can use aspects of the invention in any other processing architecture. A dataflow language is used to define interconnections among hardware elements in the matrix datapath and controlled by FSM at run time and, thus, to determine hardware functionality at run time. The interconnectivity between the matrix datapath components, elements or resources, is capable of changing every clock cycle to optimize preferred calculations. The dataflow language is used to describe the optimized functions to an application programmer. The dataflow language is also compiled to a hardware definition that is used to create aspects of the desired functionality in silicon.

20 Claims, 6 Drawing Sheets

```
//*************************************************************************
//* FUNCTION: Vector Addition
//* PURPOSE:   element by element addition of two vectors
//*************************************************************************
/
//void qst_add (
//     Word16 x[],    /* input vector 1 */
//     Word16 y[],    /* input vector 2 */
//     Word16 z[],    /* output vector  */
//     Word16 lg      /* vector length  */
//)
//{
//     Word16 i;
//     for(i=0; i<lg; i++)
//        z[i] = add(x[i],y[i]);
// return;
//}
// lg must be >= 3 state add_loadp1 {   //get &x
       fifo_read = 1;
       addr_d1 = fifo_data;
       addr_d2 = ADD(fifo_data,2)@DAGD2;          302
       addr_d3 = ADD(fifo_data,4)@DAGD3;
    } state add_loadp2 {   //get &y
       fifo_read = 1;
       addr_c1 = fifo_data;
       addr_c2 = ADD(fifo_data,2)@DAGC2;          304
       addr_c3 = ADD(fifo_data,4)@DAGC3;
    } state add_loadp3 {   //get &z
       fifo_read = 1;
       SetAddr(addr_d1)@RAM_ADDRD1;
       SetAddr(addr_d2)@RAM_ADDRD2;
       SetAddr(addr_d3)@RAM_ADDRD3;
       SetAddr(addr_c1)@RAM_ADDRC1;
       SetAddr(addr_c2)@RAM_ADDRC2;
       SetAddr(addr_c3)@RAM_ADDRC3;
       addr_d1 = ADD(addr_d1,6)@DAGD1;
       addr_d2 = ADD(addr_d2,6)@DAGD2;            306
       addr_d3 = ADD(addr_d3,6)@DAGD3;
       addr_c1 = ADD(addr_c1,6)@DAGC1;
       addr_c2 = ADD(addr_c2,6)@DAGC2;
       addr_c3 = ADD(addr_c3,6)@DAGC3;
       start_addr_d4 = fifo_data;
       start_addr_c4 = ADD(fifo_data,2)@DAGC4;
       addr_mem = ADD(fifo_data,4)@COUNTER5;
    } nextstate
       case (EQU(prog_num,13)@EQU13) : sub_s1
```

Fig. 3A

```
state add_s1 { //get &lg
    count = SUB(fifo_data,3)@COUNTER1;
    wd1 = Mem_Read()@RAM_READD1;
    wd2 = Mem_Read()@RAM_READD2;
    wd3 = Mem_Read()@RAM_READD3;         } 308
    wc1 = Mem_Read()@RAM_READC1;
    wc2 = Mem_Read()@RAM_READC2;
    wc3 = Mem_Read()@RAM_READC3;
    wresult1 = ADD(wd1, wc1)@COUNTER2;    ← 310
    wresult2 = ADD(wd2, wc2)@COUNTER3;
    wresult3 = ADD(wd3, wc3)@COUNTER4;
    Mem_Write(start_addr_d4, wresult1)@RAM_WRITE1;   ← 312
    Mem_Write(start_addr_c4, wresult2)@RAM_WRITE2;
    Mem_Write(addr_mem, wresult3)@RAM_WRITE3;
    SetAddr(addr_d1)@RAM_ADDRD1;
    SetAddr(addr_d2)@RAM_ADDRD2;
    SetAddr(addr_d3)@RAM_ADDRD3;
    SetAddr(addr_c1)@RAM_ADDRC1;
    SetAddr(addr_c2)@RAM_ADDRC2;
    SetAddr(addr_c3)@RAM_ADDRC3;
    addr_d1 = ADD(addr_d1,6)@DAGD1;
    addr_d2 = ADD(addr_d2,6)@DAGD2;
    addr_d3 = ADD(addr_d3,6)@DAGD3;
    addr_c1 = ADD(addr_c1,6)@DAGC1;
    addr_c2 = ADD(addr_c2,6)@DAGC2;
    addr_c3 = ADD(addr_c3,6)@DAGC3;
    start_addr_d4 = ADD(start_addr_d4,6)@DAGD4;
    start_addr_c4 = ADD(start_addr_c4,6)@DAGC4;
    addr_mem = ADD(addr_mem,6)@COUNTER5;
} nextstate
    case (EQU(fifo_data,3)@EQU2) : finish
    case (EQU(fifo_data,4)@EQU1) : add_last1
    case (EQU(fifo_data,5)@EQU3) : add_last2
```

Fig. 3B

```
state add_s2 {
   count = SUB(count,3)@COUNTER1;
   wd1 = Mem_Read()@RAM_READD1;
   wd2 = Mem_Read()@RAM_READD2;
   wd3 = Mem_Read()@RAM_READD3;
   wc1 = Mem_Read()@RAM_READC1;
   wc2 = Mem_Read()@RAM_READC2;
   wc3 = Mem_Read()@RAM_READC3;
   wresult1 = ADD(wd1, wc1)@COUNTER2;
   wresult2 = ADD(wd2, wc2)@COUNTER3;
   wresult3 = ADD(wd3, wc3)@COUNTER4;
   Mem_Write(start_addr_d4, wresult1)@RAM_WRITE1;
   Mem_Write(start_addr_c4, wresult2)@RAM_WRITE2;
   Mem_Write(addr_mem, wresult3)@RAM_WRITE3;
   SetAddr(addr_d1)@RAM_ADDRD1;
   SetAddr(addr_d2)@RAM_ADDRD2;
   SetAddr(addr_d3)@RAM_ADDRD3;
   SetAddr(addr_c1)@RAM_ADDRC1;
   SetAddr(addr_c2)@RAM_ADDRC2;
   SetAddr(addr_c3)@RAM_ADDRC3;
   addr_d1 = ADD(addr_d1,6)@DAGD1;
   addr_d2 = ADD(addr_d2,6)@DAGD2;
   addr_d3 = ADD(addr_d3,6)@DAGD3;
   addr_c1 = ADD(addr_c1,6)@DAGC1;
   addr_c2 = ADD(addr_c2,6)@DAGC2;
   addr_c3 = ADD(addr_c3,6)@DAGC3;
   start_addr_d4 = ADD(start_addr_d4,6)@DAGD4;
   start_addr_c4 = ADD(start_addr_c4,6)@DAGC4;
   addr_mem = ADD(addr_mem,6)@COUNTER5;
} nextstate
   case (EQU(count,3)@EQU2)  : finish
   case (EQU(count,4)@EQU1)  : add_last1
   case (EQU(count,5)@EQU3)  : add_last2
   case (1) : add_s2 state add_last2 {
   wd1 = Mem_Read()@RAM_READD1;
   wd2 = Mem_Read()@RAM_READD2;
   wc1 = Mem_Read()@RAM_READC1;
   wc2 = Mem_Read()@RAM_READC2;
   wresult1 = ADD(wd1, wc1)@COUNTER2;
   wresult2 = ADD(wd2, wc2)@COUNTER3;
   Mem_Write(start_addr_d4, wresult1)@RAM_WRITE1;
   Mem_Write(start_addr_c4, wresult2)@RAM_WRITE2;
} nextstate
   case (1) : finish state add_last1 {
   wd1 = Mem_Read()@RAM_READD1;
   wc1 = Mem_Read()@RAM_READC1;
   wresult1 = ADD(wd1, wc1)@COUNTER2;
   Mem_Write(start_addr_d4, wresult1)@RAM_WRITE1;
} nextstate
   case (1) : finish
```

DIGITAL PROCESSING ARCHITECTURE USING COMPILED DATAFLOW DEFINITION

COMPUTER PROGRAM LISTING APPENDIX

A single compact-disk read-only memory (CDROM) in compliance with 37 CFR Section 1.52 is being submitted with this application. The compact disk includes source code files and other related computer program data and information that is hereby incorporated by reference as if set forth in full in this document. The copyright owner of the source code files has no objection to the facsimile reproduction of the Appendix as filed in the Patent and Trademark Office. Otherwise all copyright rights are reserved.

The CDROM contains the following ASCII files:

| Creation Date/Time | Size in bytes | Filename |
| --- | --- | --- |
| 09/10/2003 06:09 PM | 178,350 | ALLFUNC.txt |
| 09/10/2003 06:14 PM | 186,657 | Matrix Generation.txt |
| 09/10/2003 06:15 PM | 58,353 | Quicksilver ARC Core.v1.3.txt |
| 09/12/2003 10:25 PM | 5,451 | readme-3.txt |

BACKGROUND OF THE INVENTION

This invention relates in general to computer data processing design and more specifically to a system using a compiled data flow language to define a data path in a co-processing system.

Today's computer system architecture designs are often designed with a trade off of flexibility (e.g., configurability or adaptability) versus speed. In general, if an architecture provides greater flexibility in, for example, its data flow, processor operations, memory addressing, bus accesses, etc., the speed at which a the system can operate may be compromised.

Thus, it is desirable to provide a system having flexibility while still maintaining high speed.

SUMMARY OF THE INVENTION

The invention provides a system whereby a data flow language written in relatively high-level description is compiled to a hardware definition. The hardware definition is then used to configure data flow in a target processing system at execution time, or run time. In a preferred embodiment, the target processing system includes a Reduced-Instruction Set Computer (RISC) processor in communication with a finite state machine (FSM), shared memory, on-board memory, and other resources. The FSM is generated from the dataflow definition and used for configuring matrix operations at run time. The RISC processor serves as a co-processor to an external central processing unit (CPU) that is a host processor for executing application code. Other embodiments can use aspects of the invention in any other processing architecture.

A dataflow language is used to define interconnections among hardware elements in a matrix datapath at run time and, thus, to determine hardware functionality at run time. The interconnectivity between the matrix datapath components, elements or resources, is capable of changing every clock cycle to optimize preferred calculations. The dataflow language is used to describe the optimized functions to an application programmer. The dataflow language is also compiled to a hardware definition that is used to create aspects of the desired functionality in silicon.

In one embodiment the invention provides a method for configuring a digital system, wherein the digital system includes a host processor in communication with a secondary processor, the method comprising accepting a dataflow definition description; using the dataflow definition description to design application code that is executed by the host processor at run time; using the dataflow definition description to create interconnectivity among a plurality of components within the secondary processor prior to the run time; and using the dataflow definition description to change interconnectivity in the secondary processor at run time to achieve a desired function.

BRIEF DESCRIPTION OF THE DRAWINGS

FIG. 3A is a first portion of an example of a dataflow definition for vector addition operations;

FIG. 3B is a second portion of an example of a dataflow definition for vector addition operations;

FIG. 3C is a third portion of an example of a dataflow definition for vector addition operations.

DETAILED DESCRIPTION OF THE INVENTION

Figure 1:
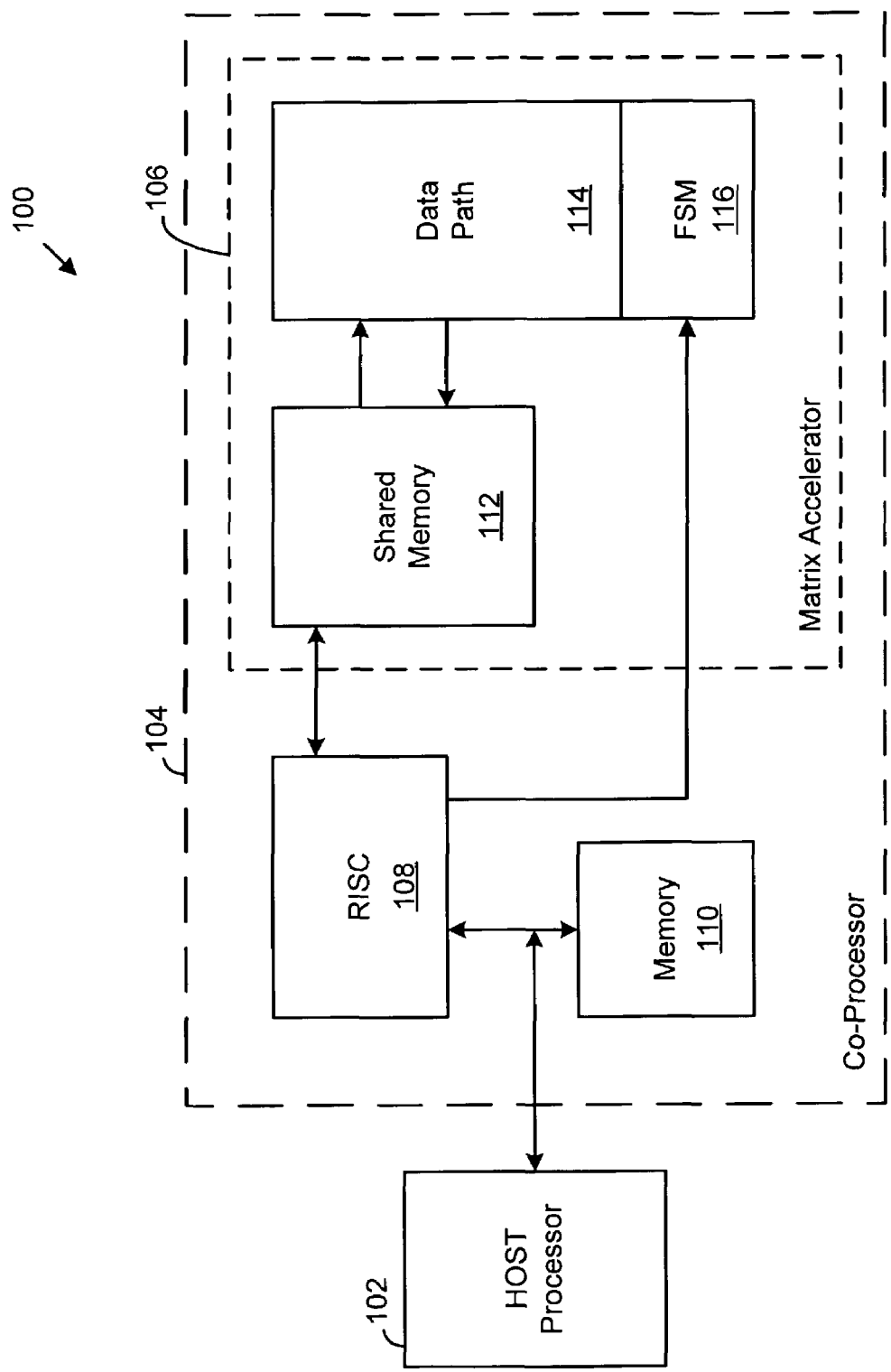
FIG. 1 illustrates a processing architecture including a compiled dataflow definition.

FIG. 1 illustrates a processing architecture including a compiled dataflow definition.

In FIG. 1, processing system 100 includes host processor 102 and co-processor 104. Note that although a preferred embodiment of the invention is discussed with respect to the specific processing architecture of FIG. 1, any type of processing architecture may be suitable for use with the invention.

Host processor 102 is used to execute application programs, or code, as is known in the art. Such programs can be written, for example, in assembly language or other native language, or in a higher-level language such as "C," etc. In general, any form of instructional execution, or even hardwired, semi-custom, custom, etc., design approaches can be used in host processor 102 and in other processing aspects of the invention.

Co-processor 104 includes various components such as reduced-instruction set (RISC) controller 108, On-board memory 110 and matrix accelerator 106. Matrix accelerator 106, in turn, includes shared memory 112 in communication with data path definitions 114 and finite state machine (FSM) 115. As discussed, the specific architecture, types of components, interconnections, and any design aspects of the processing system of FIG. 1 can be changed and the resulting processing system can still be suitable for use with the present invention. Components can be added to, or removed from those shown in FIG. 1. Different types of components can be used. For example, on-board memory can be any type and amount of memory. RISC controller 108 can be replaced with any suitable controller. Other design changes can be made.

Matrix accelerator 106 provides RISC controller 108 with ability to do fast vector operations. For example, vector add, multiply, subtract, divide, etc., can be achieved. More complex operations can also be performed by matrix accelerator 106, as is known in the art. For example, operations to implement a Fast Fourier Transform (FFT), discrete cosine transform (DCT) and other operations can be selectively programmed into the matrix accelerator.

One aspect of the invention permits such selective programming of the matrix accelerator by allowing a designer to configure data path 106 prior to manufacture by using a dataflow definition language. One embodiment of the dataflow definition language is referred to as WIFF and has been designed by Quicksilver, Inc. of San Jose, Calif. However, other dataflow definition languages suitable for use with the present invention can vary from the specific syntax, translation and compilation aspects as described herein.

Figure 2:
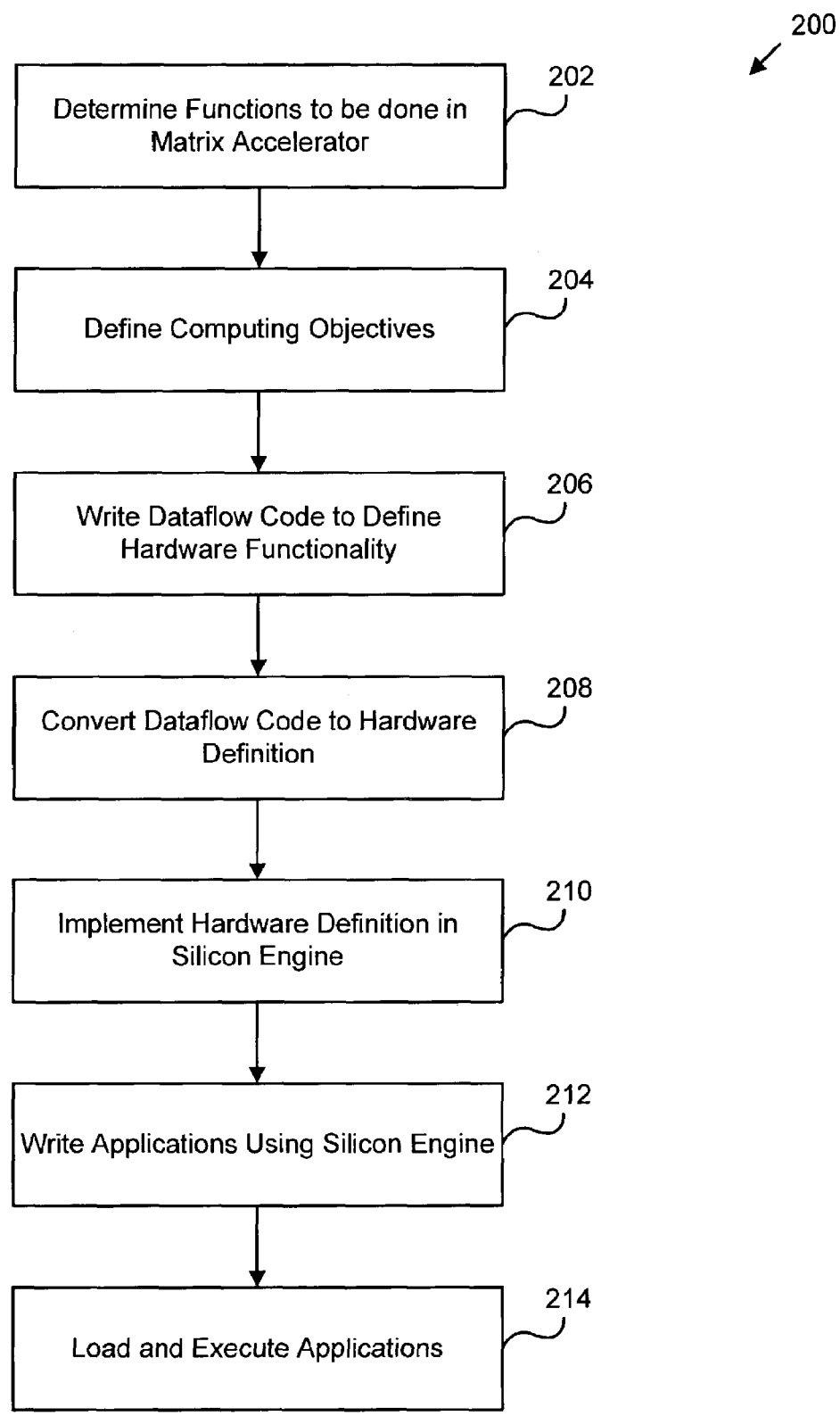
FIG. 2 shows basic steps in routine 200 to achieve product, or end-user, functionality in a target device.

One approach to design methodology according to the present invention is described in the steps illustrated in FIG. 2.

FIG. 2 shows basic steps in routine 200 to achieve product, or end-user, functionality in a target device. For example, the target device can be any type of consumer electronic device, or a device to perform any desired functionality as part of a standalone or networked system. In general, the present invention can be used to achieve any type of functionality in a processing system.

A first step of the design approach requires a designer to determine one or more functions to be performed by the matrix accelerator as illustrated at step 202. For example, a code-division multiplexed cellular telephone function may be desired. At step 204, computing objects are defined. For example, the implementation of a CDMA algorithm with a goal of achieving a target voice quality over a bandwidth constraint can dictate how fast a vector addition function must operate.

Next, at step 206, hardware definition code, such as WIFF code, is written to implement the functions at the desired performance levels in the matrix accelerator. In a preferred embodiment, the desired performance level is achieved by defining dataflow (i.e., input and output) connectivity to, and from, FSM engines. Other design approaches can use different approaches. For example, if a vector addition function must handle four additions within a single clock cycle then a dataflow definition (described in more detail, below) is defined to achieve the addition operation. In a preferred embodiment the operation is defined on a state-by-state and element-by-element basis (see, below).

At step 208 a translator, or hardware-definition language (HDL) generator, is used to convert the WIFF code to a hardware definition. For example, a popular hardware definition language is Verilog. In general, any hardware definition (e.g., resistor-transistor logic for an FSM) can be used. At step 210, the hardware definition is used to create an integrated circuit with the specified interconnectivity, or dataflow, in silicon.

At step 212 an application programmer writes an application according to an interface specification for the matrix accelerator that is determined by the functionality defined by the dataflow definition. Finally, at step 214, the application is loaded onto host processor 102 for execution. During execution the application makes use of the functionality defined by the dataflow definition in co-processor 104 in concert with matrix accelerator 106.

FIGS. 3A–C show an example of a dataflow definition for vector addition operations in accordance with the processing system of FIG. 1 and in accordance with the syntax of the WIFF language of a preferred embodiment. Details of the language, along with additional examples of dataflow definitions, can be found by consulting the Computer Program Listing Appendix provided in a CDROM provided with this application. The routine "Vector Addition" of FIGS. 3A–C can be found starting at page 102 of the definition code on the CDROM.

In FIG. 3A, instructions at 302 define a state for obtaining a first operand from an application program. Similarly, a second operation is obtained by instructions at 304. As discussed, these instructions, through their functionality descriptions, define a dataflow of the FSM of FIG. 1 for a given clock cycle, or set of cycles. The dataflow definition is compiled into a hardware definition so that an application programmer can invoke functions described in the dataflow definition language at run-time. In the present example, a vector addition operation described in the dataflow definition of FIG. 3A provides various functionality in the form of "routines" that can be called by the application programmer. With the approach of the present invention, a systems designer can write the dataflow definition to define matrix accelerator operations for a given task, product, device, etc. The operations are then implemented in silicon as one or more cycles among components in the FSM and data path. This approach provides an optimized, configurable platform that can be installed into silicon rapidly.

Instructions at 306 of FIG. 3A obtain a third parameter of the vector add function and initialize the address pointers to the operand and result locations of the additions. Note that each "state" routine (e.g., "add_loadp1," "add_loadp2," "add_loadp3," etc.) is designed to be performed within a single cycle of the matrix accelerator. Other approaches can use multiple cycles, or can combine routines, sections or instruction groups into an arbitrary number of cycles.

FIG. 3B is a successive set of instructions that immediately follow from FIG. 3A. In FIG. 3B, state routine "add_s1" includes designations at 308 that connect memory reads to adder elements and assign the results to "wires" or buses within the data paths. For example, the variable "wd1" corresponds to a wire, meaning an unclocked connection. Note that any naming convention can be used for different components, buses, etc.

The instruction at 310 instructs adder element COUNTER2 to add operands present on wires, wd1 and wc1, together and designates the output to be routed on wire "wresult1". The instruction at 312 directs a random access memory (RAM) write of the adder output to the address pointer stored in the register element "start_addr_d4".

FIG. 3C is a continuation of the vector addition dataflow definition of FIG. 3B.

In FIG. 3C, instructions at 314 describe the inner loop of the vector add operation for iteration process. All of the operations in the inner loop at 314 are accomplished in a single clock cycle. Thus, the same interconnection configuration can be maintained for many cycles. Note that the architecture of the matrix accelerator of FIG. 1 includes the ability for the data path section to reconfigure the data connections every cycle. However, it is more efficient in terms of power and noise, to minimize data path switching.

Figure 4:
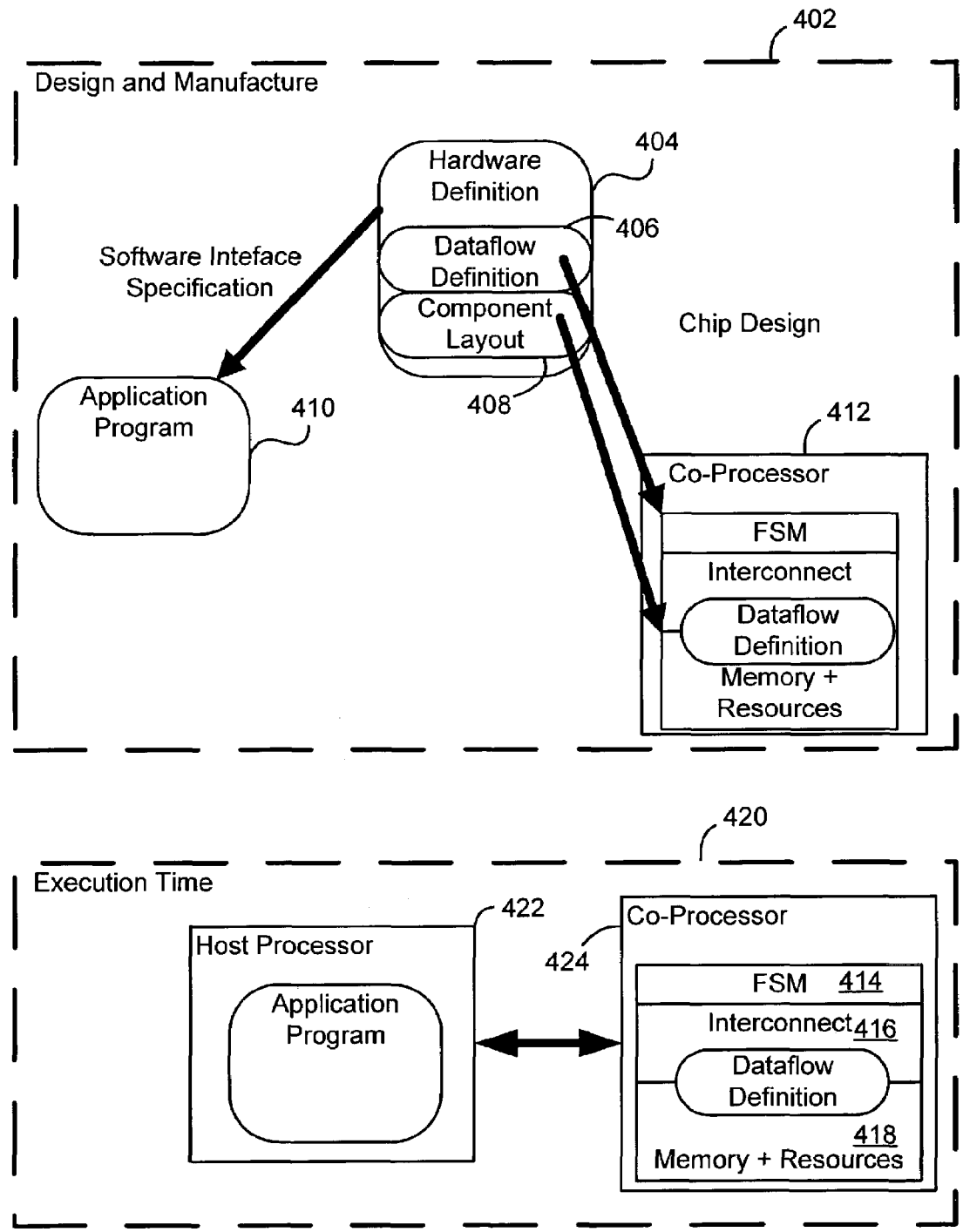
FIG. 4 illustrates manufacturing and operation aspects of a system according to the present invention

FIG. 4 illustrates manufacturing and operation aspects of a system according to the present invention.

In FIG. 4, design and manufacturing phase 402 includes development of hardware definition 404, including a component layout portion and a dataflow definition. In a preferred embodiment portions of the component layout and dataflow definition are automatically generated by compiling the hardware definition code. The format of the code in the Computer Program Listing Appendix can be used. Component layout 406 is used to create a chip design, such as by translating portions of the hardware definition into Verilog or other hardware design language. Dataflow definition 408 is also designed into the chip (in this case, the co-processor) by using any design means as is known in the art. For example, application-specific integrated circuit (ASIC), programmable gate arrays (PGA), read-only memory (ROM) or other non-volatile memory, custom or semi-custom design, etc., can be used to provide dataflow definition information.

Execution phase 420 uses host processor 422 in communication with co-processor 424. The host processor executes application program 410 instructions while, in the co-processor, FSM 414 controls interconnectivity between datapath elements using the HDL-defined components 416 in the dataflow definition to route data among memory, processing units, and other components and resources such as those at 418.

Although the invention has been described with reference to specific embodiments, these embodiments are merely illustrative, and not restrictive, of the invention. For example, all of the features described herein need not be present in an embodiment of the invention. Steps can be omitted from, added to, or modified from those shown in FIG. 2. The steps of FIG. 2 can be automated or performed manually. When automated, the location or number of hardware processing devices, or software processes, is not critical to the invention. Automated functions can be performed by hardware, software, or by a combination of both.

Thus, the scope of the invention is to be determined solely by the appended claims.

What is claimed is:

1. A method for configuring a digital system, wherein the digital system includes a host processor in communication with a secondary processor, the method comprising:
    using a dataflow definition description to create a first interconnectivity of a data path among a plurality of components within the secondary processor prior to a run time;
    receiving instructions from an application code that is executed by the host processor at a run time, the application code being created from the dataflow definition description; and
    in response to the instructions, using the dataflow definition description to change the first interconnectivity of the data path to a second interconnectivity of the data path among at least a portion of the plurality of components in the secondary processor at run time to achieve a desired function.

2. The method of claim 1, wherein the secondary processor includes a co-processor.

3. The method of claim 1, wherein the secondary processor includes a matrix accelerator.

4. The method of claim 1, wherein:
    the plurality of components is coupled to a memory in the secondary processor; and
    the dataflow definition description specifies that the data path between at least one of the plurality of components and the memory be maintained for a given interval of time.

5. The method of claim 4, wherein the given interval of time includes a single processing cycle.

6. The method of claim 4, wherein the given interval of time includes multiple processing cycles.

7. The method of claim 4, wherein the given interval of time is a single processing cycle.

8. A system for reconfiguring a data path, the system comprising:
    a host processor configured to execute application code and to provide instructions therefrom, the application code being created from a dataflow definition description; and
    a co-processor coupled to the host processor, the co-processor having logic configured to:
        use the dataflow definition description to create a first interconnectivity of the data path among a plurality of components prior to a run time;
        receive the instructions at the run time; and
        in response to the instructions, use the dataflow definition description to change the first interconnectivity of the data path to a second interconnectivity of the data path among at least a portion of the plurality of components at run time to achieve a desired function.

9. A method for configuring a digital system by using a definition language, wherein the digital system includes a configurable data path in a co-processor, a controller, and a host processor, the method comprising:
    Automatically generating control information from the definition language;
    Using the control information to direct execution of the controller at an execution time;
    Automatically generating first interconnection information from the definition language; and
    Using the first interconnection information to define one or more data paths in the configurable data path prior to the execution time;
    Generating second interconnection information from the definition language; and using the second interconnection information to change the one or more datapaths in the configurable data path at the execution time.

10. The method of claim 9, wherein the controller includes a finite state machine.

11. The method of claim 9, wherein the definition language is used to generate control logic that is compiled into silicon at a time prior to the execution time.

12. The method of claim 1, further comprising compiling the dataflow definition description into a hardware definition.

13. The method of claim 12, further comprising using the hardware definition to create aspects of the desired function in silicon.

14. The method of claim 1, wherein the first interconnectivity provides a first function different from a second function provided by the second interconnectivity.

15. The method of claim 2, wherein the co-processor includes a finite state machine.

16. The system of claim 8, wherein the co-processor includes a matrix accelerator.

17. The system of claim 8, wherein a matrix datapath in the co-processor includes the plurality of components.

18. The system of claim 8, wherein the change from the first interconnectivity to the second interconnectivity is configured to occur in one or more of a plurality of processing cycles.

19. The system of claim 8, further comprising a memory coupled to the plurality of components.

20. The system of claim 8, wherein the co-processor includes a finite state machine.

* * * * *

UNITED STATES PATENT AND TRADEMARK OFFICE
CERTIFICATE OF CORRECTION

PATENT NO. : 7,178,130 B2  Page 1 of 1
APPLICATION NO. : 10/342888
DATED : February 13, 2007
INVENTOR(S) : Chuang et al.

It is certified that error appears in the above-identified patent and that said Letters Patent is hereby corrected as shown below:

On the cover page, item 73, please replace "NVidia Corporation", with --NVIDIA Corporation--

Signed and Sealed this

Fifteenth Day of May, 2007

JON W. DUDAS
*Director of the United States Patent and Trademark Office*